(12) United States Patent
Liu et al.

(10) Patent No.: US 11,538,532 B2
(45) Date of Patent: Dec. 27, 2022

(54) ARCHITECTURES FOR STORING AND RETRIEVING SYSTEM DATA IN A NON-VOLATILE MEMORY SYSTEM

(71) Applicant: Silicon Storage Technology, Inc., San Jose, CA (US)

(72) Inventors: Xian Liu, Sunnyvale, CA (US); Chunming Wang, Shanghai (CN); Nhan Do, Saratoga, CA (US); Hieu Van Tran, San Jose, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 15 days.

(21) Appl. No.: 17/199,383

(22) Filed: Mar. 11, 2021

(65) Prior Publication Data
US 2022/0208277 A1  Jun. 30, 2022

Related U.S. Application Data

(60) Provisional application No. 63/131,624, filed on Dec. 29, 2020.

(51) Int. Cl.
| | |
|---|---|
| *G06F 11/10* | (2006.01) |
| *G06F 11/07* | (2006.01) |
| *G06F 11/30* | (2006.01) |
| *G06F 11/14* | (2006.01) |
| *G11C 16/26* | (2006.01) |
| *G11C 11/56* | (2006.01) |
| *G11C 16/04* | (2006.01) |
| *G11C 16/24* | (2006.01) |
| *H01L 23/00* | (2006.01) |
| *H01L 25/065* | (2006.01) |
| *H01L 25/18* | (2006.01) |
| *H03K 19/20* | (2006.01) |

(52) U.S. Cl.
CPC .......... *G11C 16/26* (2013.01); *G06F 11/1068* (2013.01); *H03K 19/20* (2013.01)

(58) Field of Classification Search
CPC ...... G11C 16/26; H03K 19/20; G06F 11/1068
See application file for complete search history.

(56) References Cited

U.S. PATENT DOCUMENTS

| | | | |
|---|---|---|---|
| 4,519,079 A * | 5/1985 | Hamer | G06F 11/1024 714/702 |
| 4,748,594 A | 5/1988 | Iida | |
| 5,029,130 A | 7/1991 | Yeh | |

(Continued)

FOREIGN PATENT DOCUMENTS

EP  1912121 A1 *  4/2008

OTHER PUBLICATIONS

PCT Search Report & Written Opinion corresponding to the related PCT Patent Application No. US21/25009 dated Nov. 2, 2021.

*Primary Examiner* — Guy J Lamarre
(74) *Attorney, Agent, or Firm* — DLA Piper LLP US

(57) ABSTRACT

Numerous embodiments are disclosed of improved architectures for storing and retrieving system data in a non-volatile memory system. Using these embodiments, system data is much less likely to become corrupted due to charge loss, charge redistribution, disturb effects, and other phenomena that have caused corruption in prior art non-volatile memory systems.

7 Claims, 11 Drawing Sheets

(56) References Cited

U.S. PATENT DOCUMENTS

| | | | |
|---|---|---|---|
| 6,687,162 B1 * | 2/2004 | Hsueh | G11C 16/0425 |
| | | | 365/185.21 |
| 7,868,375 B2 | 1/2011 | Liu et al. | |
| 2002/0032891 A1 | 3/2002 | Yada | |
| 2010/0302833 A1 | 12/2010 | Teramoto | |
| 2018/0336139 A1 | 11/2018 | Rao | |
| 2019/0088317 A1 * | 3/2019 | Roy | G11C 11/1673 |

* cited by examiner

ARCHITECTURES FOR STORING AND RETRIEVING SYSTEM DATA IN A NON-VOLATILE MEMORY SYSTEM

PRIORITY CLAIM

This application claims priority to U.S. Provisional Patent Application No. 63/131,624, filed on Dec. 29, 2020, and titled, "Architectures for Storing and Retrieving System Data in a Non-Volatile Memory System," which is incorporated by reference herein.

FIELD OF THE INVENTION

Numerous embodiments are disclosed of improved architectures for storing and retrieving system data in a non-volatile memory system.

BACKGROUND OF THE INVENTION

Non-volatile memory systems are well-known in the prior art. FIG. 1 depicts prior art non-volatile memory system 100. Non-volatile memory system 100 comprises array 101, row decoder 102, column decoder 103, and sense amplifier 104. Array 101 comprises an array of non-volatile memory cells arranged in rows and columns. Row decoder 102 is coupled to each row of non-volatile memory cells in array 101 and enables one or more rows for read, erase, or program operations, typically in response to a received row address. Column decoder 103 is coupled to each column of non-volatile memory cells in array 101 and enables one or more columns for read, erase, or program operations, typically in response to a received column address. When the non-volatile memory cells are flash memory cells, row decoder 102 typically is coupled to a word line of each row of cells, and column decoder 103 typically is coupled to a bit line of each column of cells. Sense amplifier 104 is used during a read operation to sense the value stored in the selected cell or cells.

Various designs of non-volatile memory cells are known in the prior art. For example, U.S. Pat. No. 5,029,130 ("the '130 patent"), which is incorporated herein by reference, discloses an array of split gate non-volatile memory cells, which are a type of flash memory cells. Such a memory cell 210 is shown in FIG. 2. Each memory cell 210 includes source region 14 and drain region 16 formed in semiconductor substrate 12, with channel region 18 there between. Floating gate 20 is formed over and insulated from (and controls the conductivity of) a first portion of the channel region 18, and over a portion of the source region 14. Word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline 24 is coupled to drain region 16.

Memory cell 210 is erased (where electrons are removed from the floating gate) by placing a high positive voltage on the word line terminal 22 in relation to the substrate region 12 which causes electrons on the floating gate 20 to tunnel through the intermediate insulation from the floating gate 20 to the word line terminal 22 via Fowler-Nordheim tunneling.

Memory cell 210 is programmed (where electrons are placed on the floating gate) by placing a positive voltage on the word line terminal 22, and a positive voltage on the source region 14. Electrons will flow from the drain region 16 toward the source region 14. The electrons will accelerate and become heated when they move through the channel region 18 under the gap between the word line terminal 22 and the floating gate 20, and the channel region 18 under the floating gate 20. Some of the heated electrons will be injected through the gate oxide onto the floating gate 20 due to the attractive electrostatic force from the floating gate 20 and the reduction in oxide energy barrier caused by said force.

Memory cell 210 is read by placing positive read voltages on the drain region 16 and word line terminal 22 (which turns on the portion of the channel region 18 under the word line terminal) in relation to the source region 14. If the floating gate 20 is positively charged (i.e. erased of electrons), then the portion of the channel region 18 under the floating gate 20 is turned on as well, and current will flow across the channel region 18 to the source region 14, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18 to the source region 14, which is sensed as the programmed or "0" state.

Table No. 1 depicts typical voltage/current ranges that can be applied to the terminals of memory cell 210 for performing read, erase, and program operations:

TABLE NO. 1

Operation of Flash Memory Cell 210 of FIG. 3

|  | WL | BL | SL |
| --- | --- | --- | --- |
| Read | 2-3 V | 0.6-2 V | 0 V |
| Erase | ~11-13 V | 0 V | 0 V |
| Program | 1-2 V | 0.1-3 µA | 9-10 V |

Other split gate memory cell configurations, which are other types of flash memory cells, are known. For example, FIG. 3 depicts a four-gate memory cell 310 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 7,868,375, which is incorporated herein by reference for all purposes. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage/current ranges that can be applied to the terminals of memory cell 310 for performing read, erase, and program operations:

TABLE NO. 2

Operation of Flash Memory Cell 310 of FIG. 3

|  | WL/SG | BL | CG | EG | SL |
| --- | --- | --- | --- | --- | --- |
| Read | 0.7-3.6 V | 0.4-2 V | 0-3.6 V | 0-3.6 V | 0 V |
| Erase | 0 V | 0 V | 0 V/-8 V | 8-12 V | 0 V |
| Program | 0.5-2 V | 0.1-1 µA | 8-11 V | 4-8 V | 4-5 V |

FIG. 4 depicts a three-gate memory cell 410, which is another type of flash memory cell. Memory cell 410 is identical to the memory cell 310 of FIG. 3 except that memory cell 410 does not have a separate control gate. The erase operation (whereby erasing occurs through use of the erase gate) and read operation are similar to that of the FIG. 3 except there is no control gate bias applied. The programming operation also is done without the control gate bias, and as a result, a higher voltage must be applied on the source line during a program operation to compensate for a lack of control gate bias.

Table No. 3 depicts typical voltage/current ranges that can be applied to the terminals of memory cell 410 for performing read, erase, and program operations:

TABLE NO. 3

Operation of Flash Memory Cell 410 of FIG. 4

|         | WL/SG     | BL        | EG       | SL    |
|---------|-----------|-----------|----------|-------|
| Read    | 0.7-3.6 V | 0.4-2 V   | 0-3.6 V  | 0 V   |
| Erase   | 0 V       | 0 V       | 10-12 V  | 0 V   |
| Program | 0.5-2 V   | 0.5-3 µA  | 4.5 V    | 7-9 V |

The methods and means described herein may apply to other non-volatile memory technologies such as FINFET split gate flash or stack gate flash memory, NAND flash, SONOS (silicon-oxide-nitride-oxide-silicon, charge trap in nitride), MONO S (metal-oxide-nitride-oxide-silicon, metal charge trap in nitride), ReRAM (resistive ram), PCM (phase change memory), MRAM (magnetic ram), FeRAM (ferroelectric ram), CT (charge trap) memory, CN (carbon-nanotube) memory, OTP (bi-level or multi-level one time programmable), and CeRAM (correlated electron ram), without limitation.

With reference to FIG. 5, prior art non-volatile memory system 100 sometimes creates and maintains protected area 501 within array 101. Protected area 501 can then be used to store configuration data, trim data, fuses, and other types of data that are essential to the operation of non-volatile memory system 100, which will be referred to herein as "system data" or "system bits". User data will not be stored in protected area 501, and, optionally, protected area 501 is not accessible for read, erase, and program operations initiated from a source outside of non-volatile memory system 100.

Because the data stored in protected area 501 is critical to the accurate functioning of non-volatile memory system 100, the data stored in protected area 501 needs extra protection from low-probability data loss events such as charge loss, charge movement, read disturb, radiation-induced soft errors, and other mechanisms which cause changes in the read current/voltage of a small fraction of the cells.

One prior art approach is to store each system bit in protected area 501 in two non-volatile memory cells in a redundant fashion. In one approach, the read current from the two cells can be summed and compared against a reference value to determine the stored value.

However, even with redundancy, in some non-volatile memory cell designs, charge loss, charge redistribution, disturb, or other physical changes in the non-volatile memory cells will cause the cells to flip predominantly from a "1" state to "0" state, or from a "0" state to "1" state depending on the architecture of the non-volatile memory cell.

This can corrupt the system bit. For example, if one of two non-volatile memory cells flips from a "0" state to a "1" state, the total read current will exceed the reference current, and the sensed data will flip from "0" to "1."

What is needed is an embodiment for storing important system data in a non-volatile memory array so that the system data is less likely to become corrupted from charge loss, charge redistribution, disturb effects, or other physical changes in the non-volatile memory cell which cause a change in the read current or voltage, without limitation.

SUMMARY OF THE INVENTION

Numerous embodiments are disclosed of improved architectures for storing and retrieving system data in a non-volatile memory system. Using these embodiments, system data is much less likely to become corrupted due to charge loss, charge redistribution, disturb effects, and other phenomena that have caused data corruption in prior art non-volatile memory systems.

In one embodiment, a non-volatile memory system comprises an array of non-volatile memory cells arranged into rows and columns; a sense amplifier configured during a read operation to receive current from a first non-volatile memory cell in a first column of the array and to indicate a first value stored in the first non-volatile memory cell and to receive current from a second non-volatile memory cell in a second column of the array and to indicate a second value stored in the second non-volatile memory cell; and a logic circuit for receiving from the sense amplifier the first value and the second value and for generating a data bit output based on the first value and the second value.

In another embodiment, a non-volatile memory system comprises an array of non-volatile memory cells arranged into rows and columns; and a sense amplifier configured during a read operation to receive combined current from a first non-volatile memory cell and a second non-volatile memory cell in a selected column of the array and to generate a data bit output indicating a value based on the combined current.

In another embodiment, a non-volatile memory system, comprises an array of non-volatile memory cells arranged into rows and columns, each row comprising a word of non-volatile memory cells and error correction code data calculated from the word; a sense amplifier configured during a read operation to receive current from the array and to output a word and error correction code data for the word; and an error correction code engine for correcting one or more errors in the word using the error correction code data for the word.

DETAILED DESCRIPTION OF THE INVENTION

Figure 1:
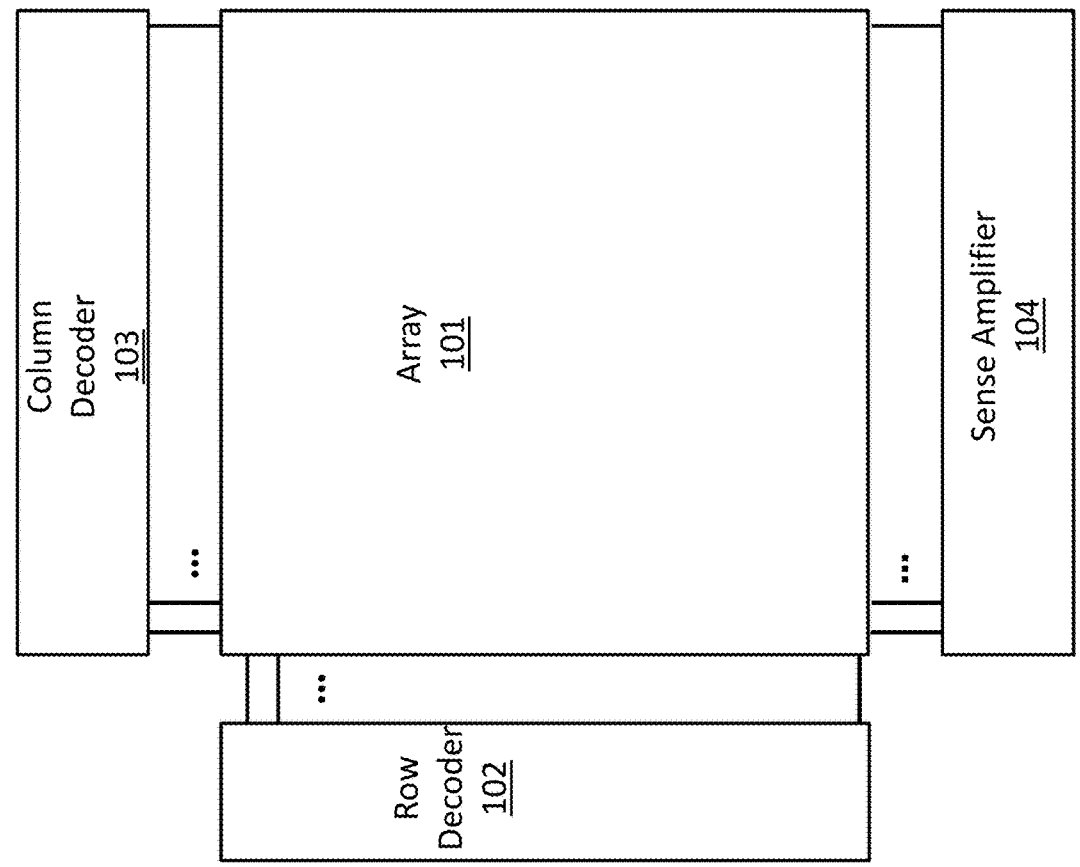
FIG. 1 depicts a prior art non-volatile memory system.
Figure 2:
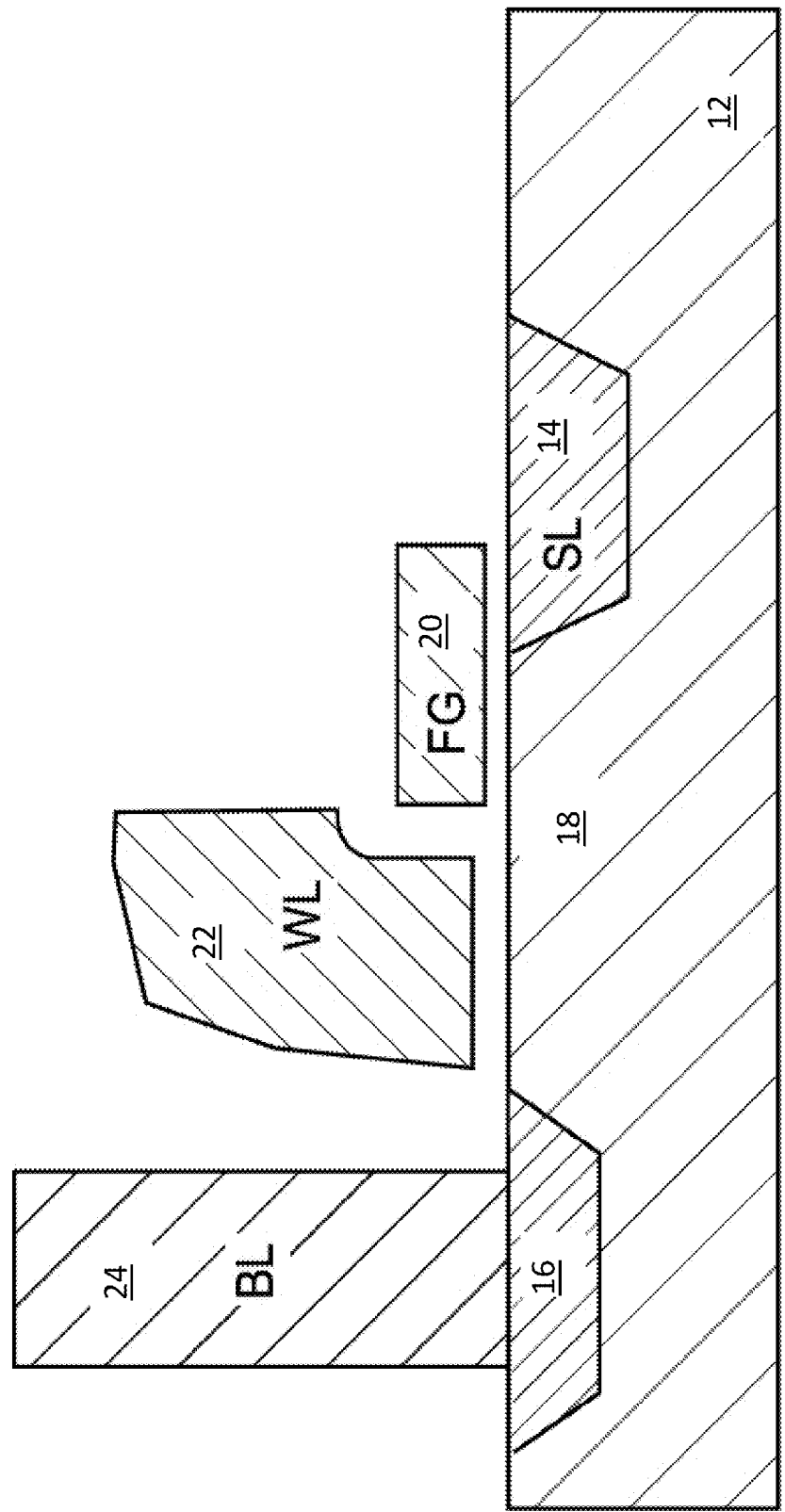
FIG. 2 depicts a prior art split gate flash memory cell.
Figure 3:
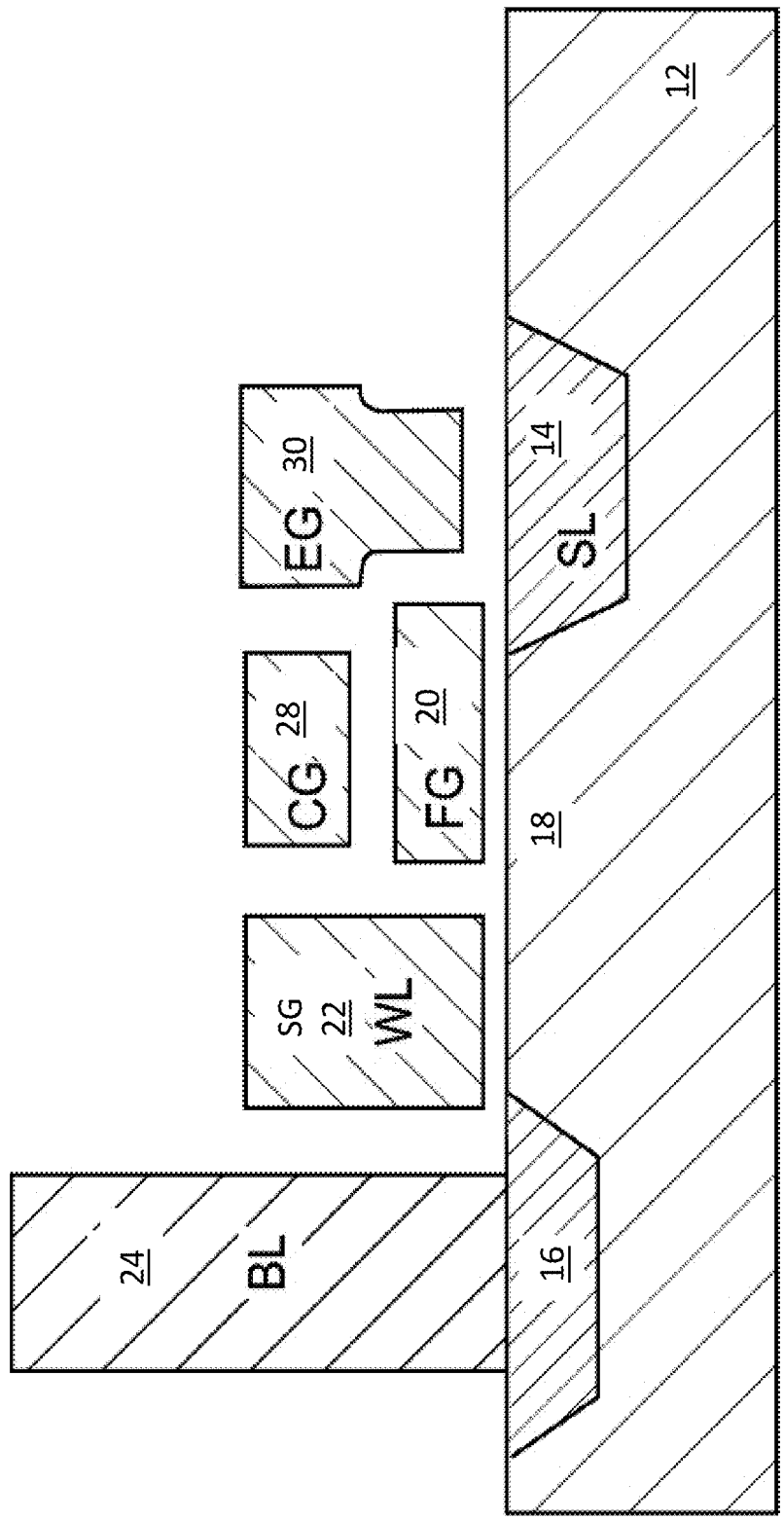
FIG. 3 depicts another prior art split gate flash memory cell.
Figure 4:
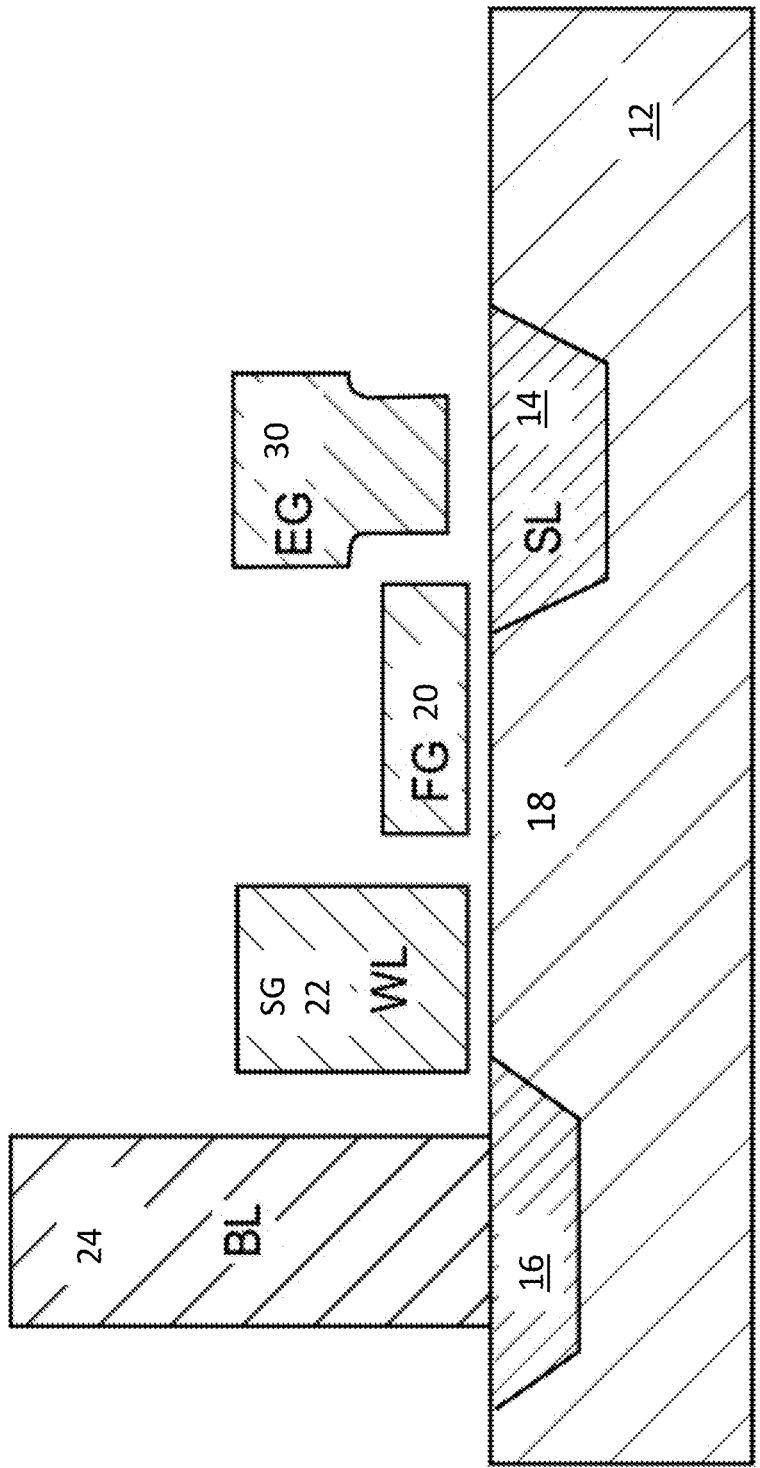
FIG. 4 depicts another prior art split gate flash memory cell.
Figure 5:
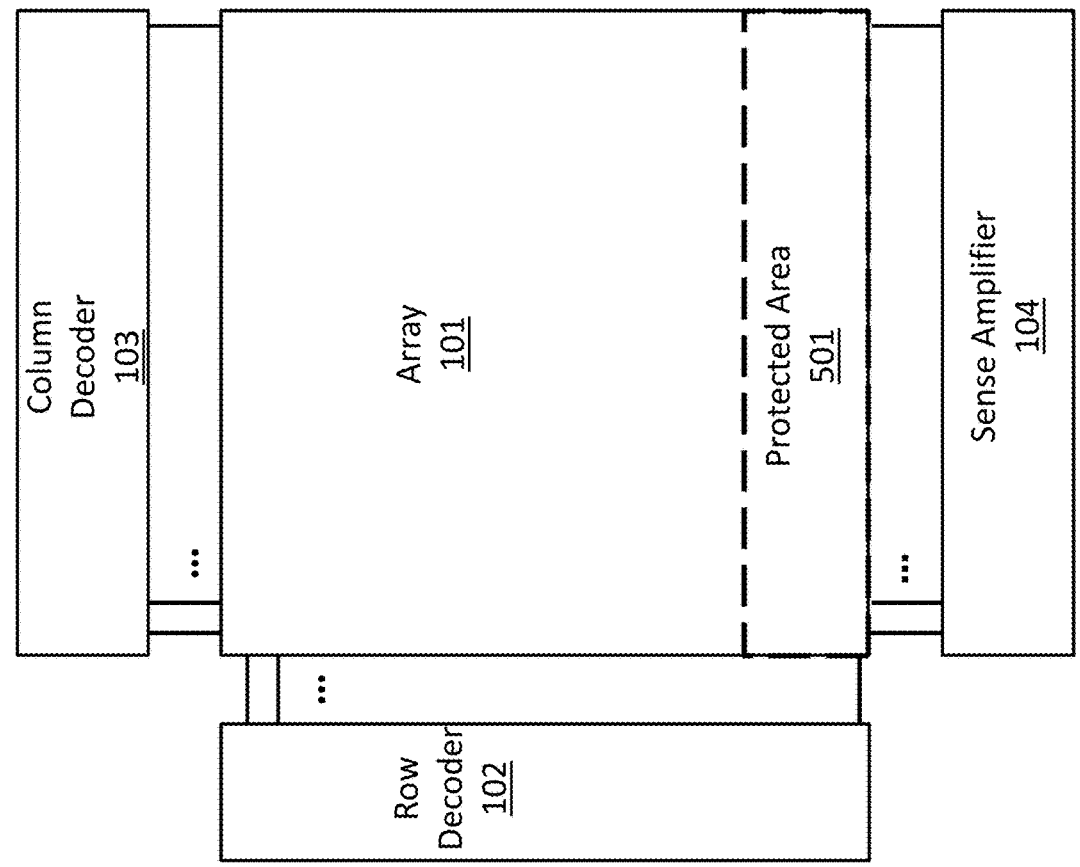
FIG. 5 depicts a prior art non-volatile memory system with a protected area.
Figure 6:
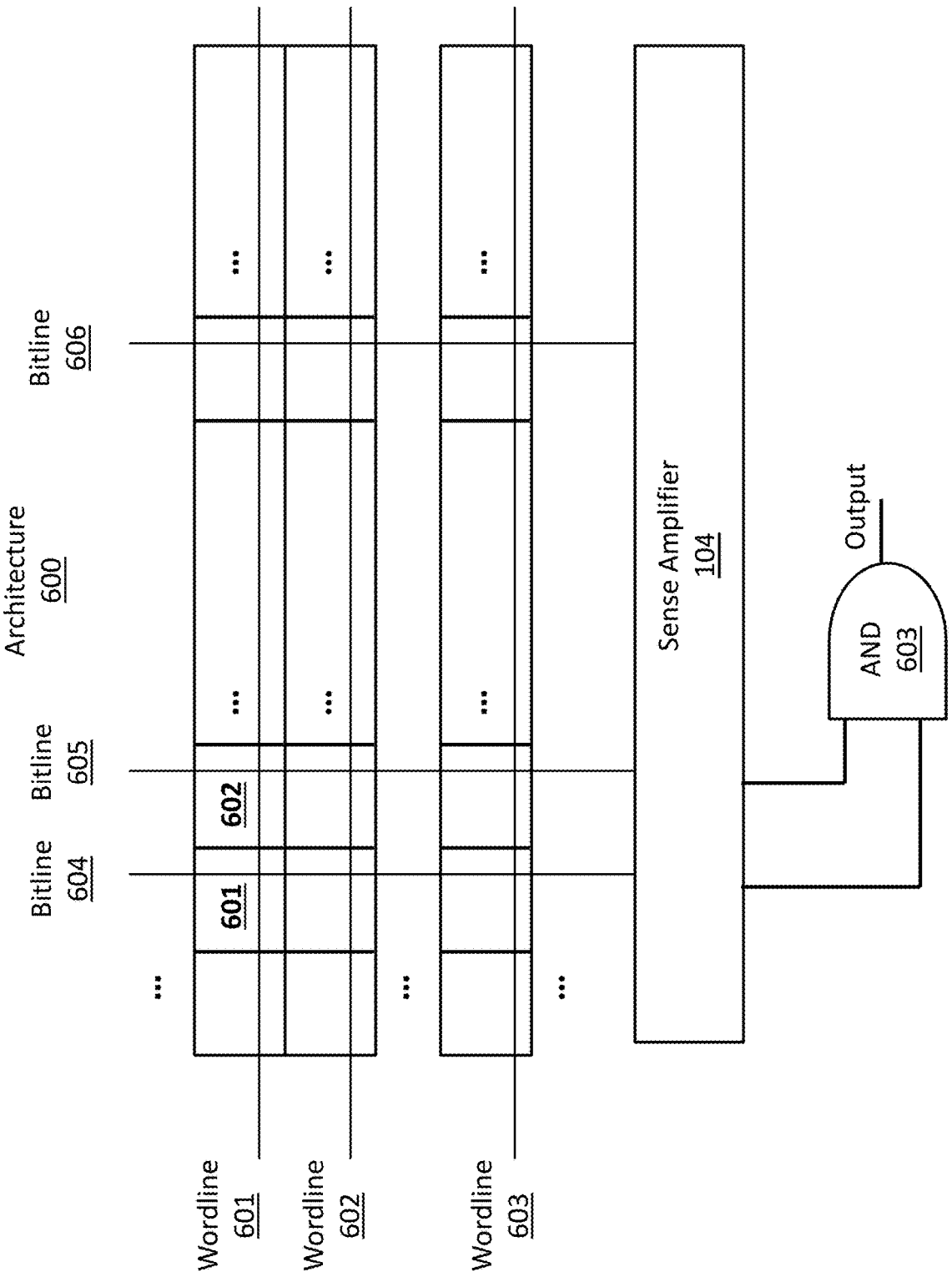
FIG. 6 depicts another embodiment of a system data architecture.
Figure 7:
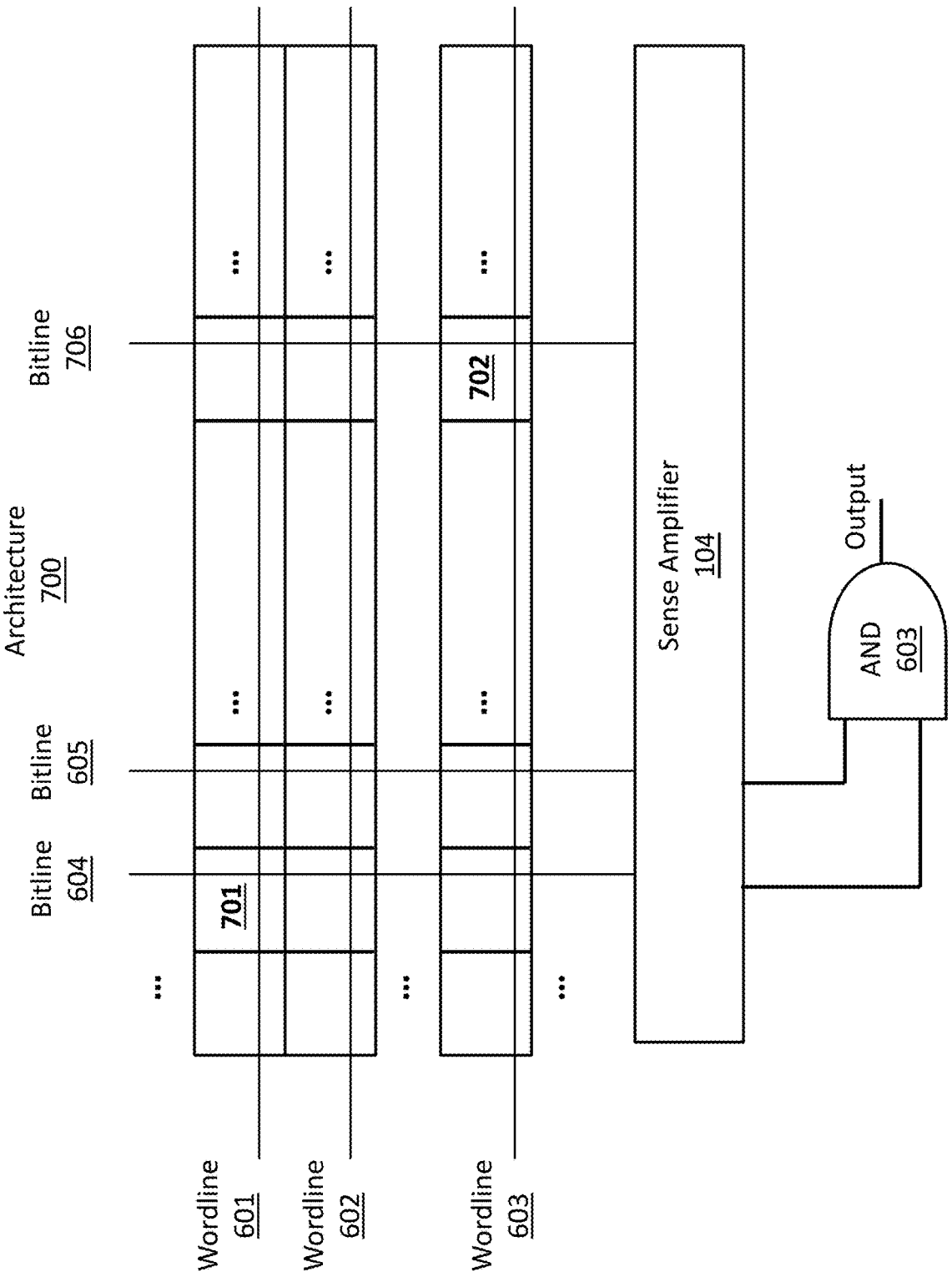
FIG. 7 depicts another embodiment of a system data architecture.
Figure 8:
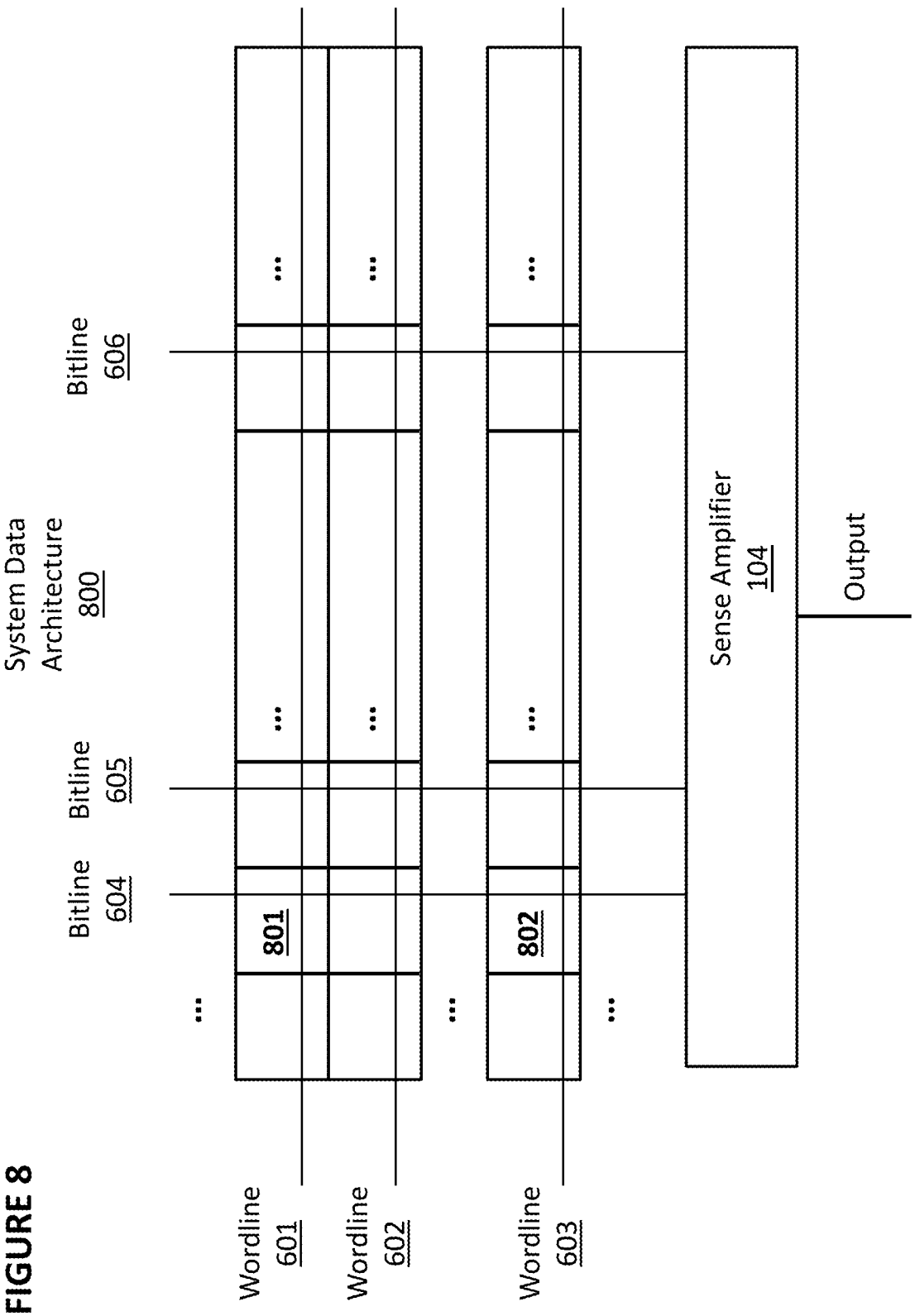
FIG. 8 depicts another embodiment of a system data architecture.

FIGS. 6-8 depict embodiments that are particularly suitable for non-volatile memory (NVM) cell designs where a charge loss, charge redistribution, disturb, or other physical or electrical changes in the NVM cell will cause a cell to gravitate towards a "1" state, which might flip a stored "0" to a "1" but will not affect a stored "1".

FIG. 6 depicts system data architecture 600. Each bit of system data is written into two redundant NVM cells, such as cells 601 and 602, located in the same row accessible by the same word line, such as wordline 601, and in different columns accessible by different bit lines, such as bit lines 604 and 605.

During a read operation, current from NVM cells 601 and 602 are simultaneously but independently sensed by sense amplifier 104 against a reference current to determine their respective logic states. Data read from the two cells as output by sense amplifier 104 (which indicates a first value stored one of the two NVM cells 601, 602 and a second value stored in the other of the two NVM cells 601, 602) are routed through AND device 603 (a logic device performing an AND function, which can be implemented using hardware logic or by firmware executed on a controller or processor) to generate the final system data (indicated by "Output").

If NVM cells 601 and 602 originally stored a "0" and neither cell has flipped, then the output will be a "0". If NVM cells 601 and 602 originally stored a "0" and one of the two NVM cells 601, 602 has flipped from a "0" to a "1," the output will still be a "0" because the output of AND device 603 will be "0". The probability of both NVM cells flipping from a "0" to a "1" is extremely low.

If NVM cells 601 and 602 originally stored a 1, then it is expected that both NVM cells 601 and 602 will still store a "1" because the underlying NVM cell architecture is assumed to be of the type where a leakage or disturb will cause a "0" to flip to a "1" but will not cause a "1" to flip to a "0". Bitline 606 and wordline 603 are shown for completeness.

FIG. 7 depicts system data architecture 700. Each bit of system data is written into two redundant NVM cells. The redundant NVM cells each can be located in any row and in any column. That is, there is no restriction on where the redundant NVM cells can be placed, and they need not be located in the same row or column or adjacent rows or columns. In this example, a pair of redundant bits are stored in NVM cell 701 accessible by wordline 601 and bit line 604 and in NVM cell 702 accessible by wordline 603 and bitline 606. Bitline 602 and wordline 605 are shown for completeness.

During a read operation, current from NVM cells 701 and 702 are independently sensed by sense amplifier 104 against a reference current to determine their respective logic states. Read data from the two NVM cells output by sense amplifier 104 (which indicates a first value stored one of the two NVM cells 701, 702 and a second value stored in the other of the two NVM cells 701, 702) are processed with AND device 603 (a logic device performing an AND function, which can be implemented using hardware logic or by firmware executed on a controller or processor) to generate the final system data (indicated by "Output").

If NVM cells 701 and 702 originally stored a "0" and neither cell has flipped, then the output will be a "0". If NVM cells 701 and 702 originally stored a "0" and one of the two NVM cells 701, 702 has flipped from a "0" to a "1," the final data will still be a "0" because the output of the AND operation will be "0". The probability of both NVM cells 701 and 702 flipping from a "0" to a "1" is extremely low.

If NVM cells 701 and 702 originally stored a "1", then it is expected that both will still store a "1" because the underlying NVM cell architecture is assumed to be of the type where a leakage, disturb, or other changes will cause a "0" to flip to a "1" but will not cause a "1" to flip to a "0".

FIG. 8 depicts system data architecture 800. Each bit of system data is written into two redundant NVM cells, such as NVM cells 801 and 802, located in the same column accessible by the same bit line, such as bitline 604, but located in different rows accessible by different wordlines, such as wordlines 601 and 603. Bitlines 605, 606 and wordline 602 are shown for completeness.

During a read operation, both wordlines 601 and 603 are selected. Read current from NVM cells 801 and 802 are combined in the common bitline 604. The summed current is sensed by sense amplifier 104 against a reference current to determine its logic state. The reference current is set to a level within a range which is: higher than the sum of a typical 0-state read current for the NVM cells and the upper limit of a neutral floating gate (FG) read current (for NVM cells which use charge storage in a polysilicon FG, where the upper limit refers to the upper limit of the range of neutral FG read current for NVM cells in the array); or higher than the sum of typical 0-state read current plus the saturation point of 0-state read current movement (for NVM cells which use other storage mechanisms). The reference level is also lower than two times the lower limit of read current of 1-state cells which are read immediately after being set to 1-state.

During production test screen of a device following system data architecture 800, a read with the reference current within the above mentioned range is performed on the protected area 501, to guarantee that the two NVM cells 801 and 802 can be erased sufficiently to ensure the combined read current exceeds the reference level, under worst-case erase and read conditions, where the "worst case" is the weakest erase and read conditions across specified process/temperature/voltage ranges, which can vary from technology to technology. These conditions typically are captured during testing.

If the stored data in selected NVM cells 801 and 802 is a "0" and neither NVM cell flips, then the final data output by sense amplifier 104, (indicated by "Output") is still a "0". If the stored data in selected NVM calls 801 and 802 is "0", and one of the two NVM cells 801, 802 has flipped from a "0" to a "1," the combined read current of the two NVM cells will saturate before it exceeds the reference current, and the final data will still be deemed by sense amplifier 104 to be a "0". The probability of both NVM cells 801, 802 flipping from a "0" to a "1" is extremely low.

If NVM cells 801 and 802 originally stored a "1", then it is expected that both NVM cells 801, 802 will still store a "1" because the underlying NVM cell architecture is assumed to be of the type where a leakage, disturb, or other changes will cause a "0" to flip to a "1" but will not cause a "1" to flip to a "0".

Figure 9:
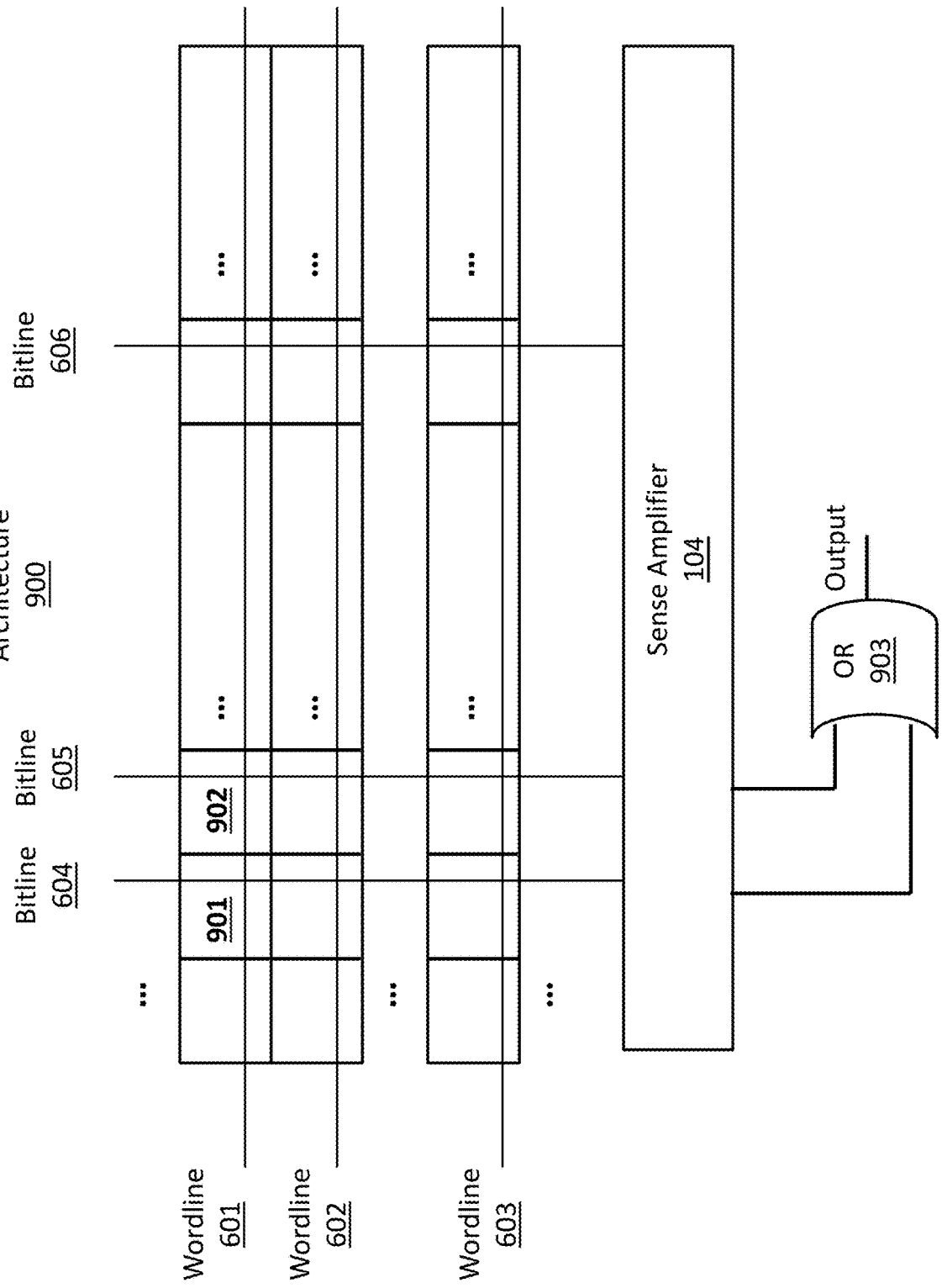
FIG. 9 depicts another embodiment of a system data architecture.
Figure 10:
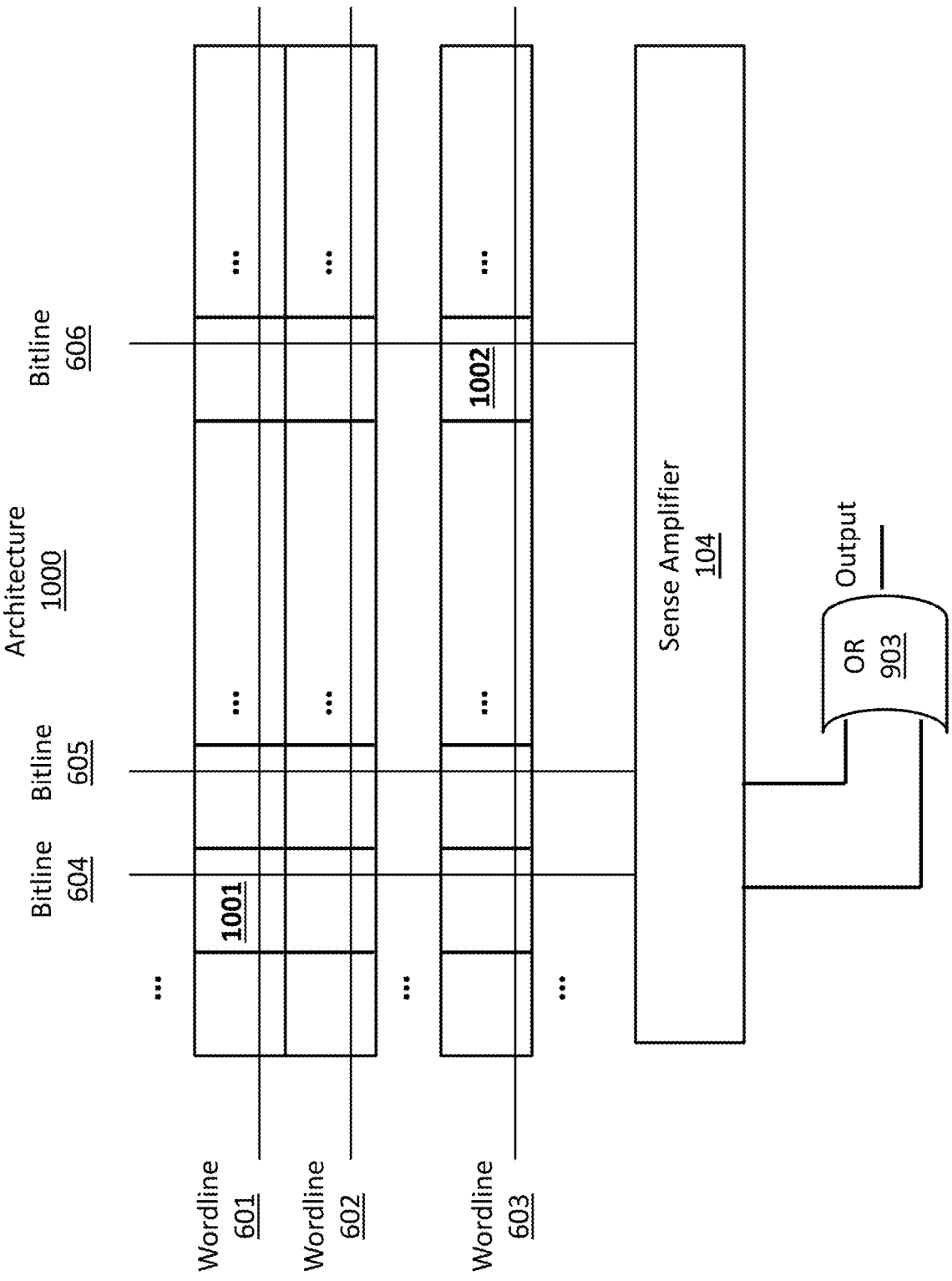
FIG. 10 depicts another embodiment of a system data architecture.

FIGS. 9-10 depict embodiments that are particularly suitable for NVM cell designs where a charge loss, charge redistribution, or disturb will cause a cell to gravitate towards a "0" state, which might flip a stored "1" to a "0" but will not affect a stored "0".

FIG. 9 depicts system data architecture 900. Each bit of system data is written into two redundant NVM cells, such as cells 901 and 902, located in the same row accessible by the same wordline, such as wordline 601, but located in different columns accessible by different bitlines, such as bitlines 604 and 605. Bitline 606 and wordlines 602, 603 are shown for completeness.

During a read operation, current from NVM cells 901 and 902 are simultaneously but independently sensed against a reference current by sense amplifier 104 to determine a first value stored in NVM cell 901 and a second value stored in NVM 902. Read data from the two NVM cells output by sense amplifier 104 are processed with OR device 903 (a logic device performing an OR function, which can be implemented using hardware logic or by firmware executed on a controller or processor) to generate the final system data (indicated by "Output").

If NVM cells 901 and 902 originally stored a "1" and neither cell has flipped, then the output will be a "1". If NVM cells 901 and 902 originally stored a "1" and one of the two NVM cells has flipped from a "1" to a "0," the final data will still be a "1" because the output of OR device 903 will be "1". The probability of both NVM cells 901, 902 flipping from a "1" to a "0" is extremely low.

If NVM cells 901 and 902 originally stored a "0", then it is expected that both NVM cells 901, 902 will still store a "0" because this scheme will only be used in NVM cell architecture where leakage, disturb, or other changes will cause a "1" to flip to a "0" but will not cause a "0" to flip.

FIG. 10 depicts system data architecture 1000. Each bit of system data is written into two redundant NVM cells. The redundant NVM cells each can be located in any row and column. That is, there is no restriction on where the NVM cells can be placed, and they need not be located in the same row or column or adjacent rows or columns.

In this example, a pair of redundant bits are stored in NVM cell 1001 accessible by wordline 601 and bit line 604 and in NVM cell 1002 accessible by wordline 603 and bitline 606. Bitline 605 and wordline 602 are shown for completeness.

During a read operation, current from NVM cells 1001 and 1002 are independently sensed against a reference current by sense amplifier 104 to determine a first value stored in NVM cell 1001 and a second value stored in NVM cell 1002. Read data from the two NVM cells output by sense amplifier 104 are processed with OR device 903 (a logic device performing an OR function, which can be implemented using hardware logic or by firmware executed on a controller or processor) to generate the final system data (indicated by "Output").

If NVM cells 1001 and 1002 originally stored a "1" and neither NVM cell has flipped, then the output will be a "1". If NVM cells 1001 and 1002 originally stored a "1" and one of the two NVM cells has flipped from a "1" to a "0," the final data will still be a "1" because the output of OR device 903 will be "1". The probability of both NVM cells 1001, 1002 flipping from a "1" to a "0" is extremely low.

If NVM cells 1001 and 1002 originally stored a "0", then it is expected that both NVM cells 1001, 1002 will still store a "0" because this scheme will only be used in NVM cell architecture where leakage, disturb, or other changes will cause a "1" to flip to a "0" but will not cause a "0" to flip.

Figure 11:
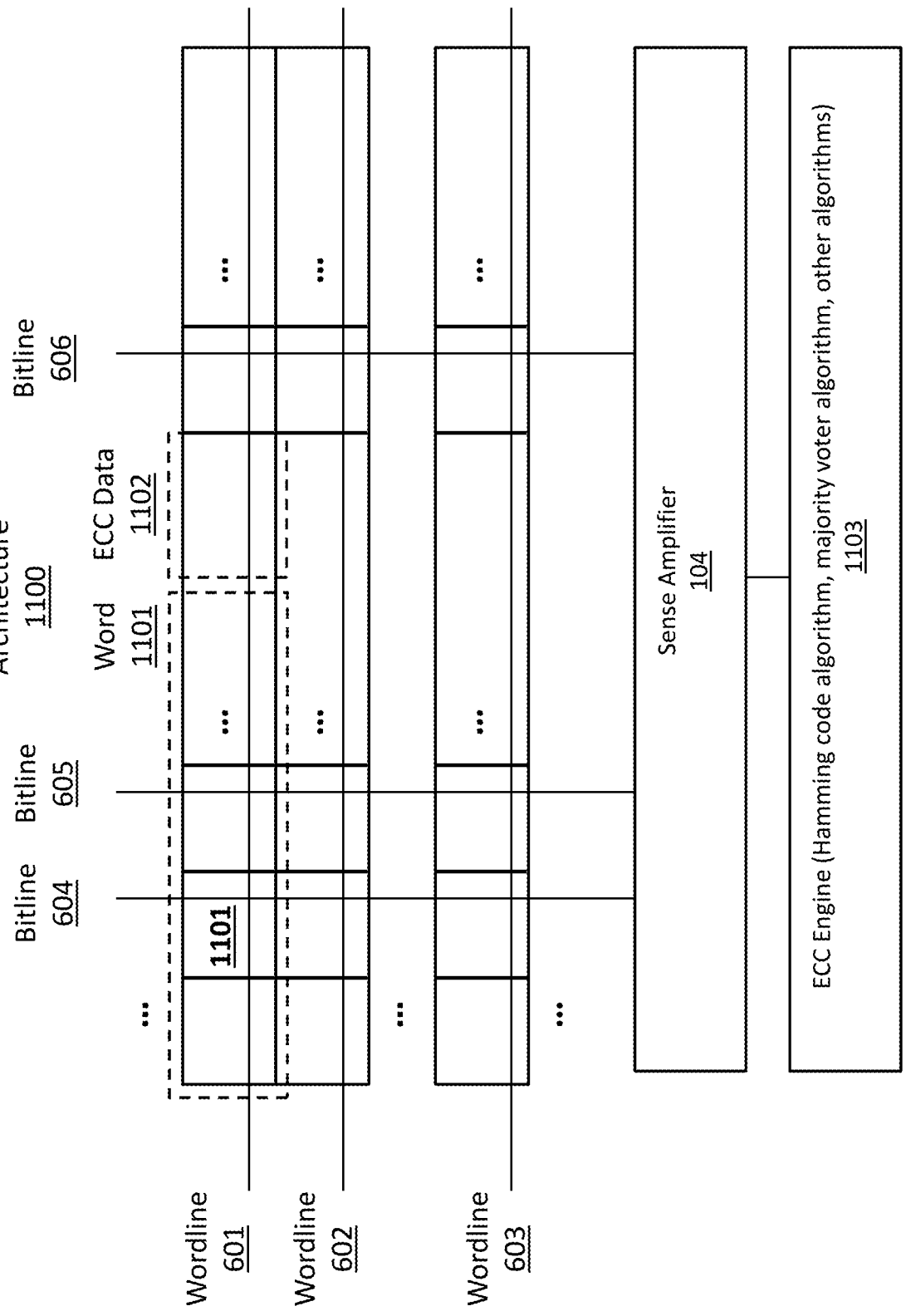
FIG. 11 depicts another embodiment of a system data architecture.

FIG. 11 depicts an embodiment that is suitable for: (1) NVM cell designs where a charge loss, charge redistribution, disturb, or other physical changes to the cell will cause a cell to gravitate towards a "0" state, which might flip a stored "1" to a "0" but will not affect a stored "0"; (2) NVM cell designs where aforementioned changes will cause a cell to gravitate towards a "1" state, which might flip a stored "0" to a "1" but will not affect a stored "1"; and (3) NVM cell designs where aforementioned changes will cause an NVM cell to gravitate towards either state, which might flip some stored "0"s to "1"s but also might flip some stored "1"s to "0" s.

FIG. 11 depicts system data architecture 1100. Here, each word of system data, such as word 1101, is stored with associated error correction code data, such as error correction code (ECC) data 1102 in a row. Each system bit is stored in a word and is stored without redundancy. Multiple words may be stored in a row, each with there associated error correction code data, without exceeding the scope.

Here, ECC data 1102 is generated for word 1101 using an ECC, such as the Hamming code, or a code generated by the majority voter algorithm (where data is stored in N redundant physical cells and the value of the stored data is deemed to be the value indicated by a majority of the N cells), to perform error detection and error correction such as 2-bit error detection and 1-bit error correction scheme. In place of ECC data 1102, a parity bit scheme may be utilized to indicate error detection without correction. When bit 1101 is read, the entire word 1101 and ECC data 1102 are read by sense amplifier 104 and sent to ECC engine 1103. That is, sense amplifier 104 receives current from the array and outputs a word and error correction code data for the word to ECC engine 1103. If any single bit in word 1101 has flipped in either direction, the error will be detected and/or corrected successfully by ECC engine 1103. The probability of more than one bit flipping is extremely low.

In one embodiment, system data architecture 1100 is additionally implemented with redundancy such as using multiple cells for each system bit to further enhance the reliability such as for functional safety for automotive applications. For example, each system bit can be stored in two cells in two rows or two columns, as described in previous embodiments.

In one embodiment, ECC engine 1103 is implemented using an external controller or firmware.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A system, comprising:
   an array of non-volatile memory cells arranged into rows and columns;
   a sense amplifier to receive current during a read operation from a first non-volatile memory cell in a first column of the array and to indicate a first value stored in the first non-volatile memory cell and to receive current during the read operation from a second non-volatile memory cell in a second column of the array and to indicate a second value stored in the second non-volatile memory cell; and
   a logic circuit to receive from the sense amplifier the indicated first value and the indicated second value and to perform an AND operation on the first indicated value and the second indicated value to generate a data bit output based on the indicated first value and the indicated second value.

2. The system of claim 1, wherein the first non-volatile memory cell and the second non-volatile memory cell are in the same row in the array.

3. The system of claim 1, wherein the first non-volatile memory cell and the second non-volatile memory cell are in different rows in the array.

4. A system, comprising:
   an array of non-volatile memory cells arranged into rows and columns;
   a sense amplifier to receive current during a read operation from a first non-volatile memory cell in a first column of the array and to indicate a first value stored in the first non-volatile memory cell and to receive current during the read operation from a second non-volatile memory cell in a second column of the array and to indicate a second value stored in the second non-volatile memory cell; and
   a logic circuit to receive from the sense amplifier the indicated first value and the indicated second value and to perform an OR operation on the first indicated value and the second indicated value to generate a data bit output.

5. The system of claim 4, wherein the first non-volatile memory cell and the second non-volatile memory cell are in the same row in the array.

6. The system of claim 4, wherein the first non-volatile memory cell and the second non-volatile memory cell are in different rows in the array.

7. A system, comprising:
   an array of non-volatile memory cells arranged into rows and columns; and
   a sense amplifier to receive combined current during a read operation from a first non-volatile memory cell and a second non-volatile memory cell in a selected column of the array and to generate a data bit output indicating a value based on a comparison of the combined current to a reference current.

* * * * *